(12) United States Patent
Teraji et al.

(10) Patent No.: US 9,431,558 B2
(45) Date of Patent: Aug. 30, 2016

(54) CIGS TYPE COMPOUND SOLAR CELL

(71) Applicant: NITTO DENKO CORPORATION, Ibaraki-shi, Osaka (JP)

(72) Inventors: Seiki Teraji, Ibaraki (JP); Kazunori Kawamura, Ibaraki (JP); Yusuke Yamamoto, Ibaraki (JP); Hiroto Nishii, Ibaraki (JP); Taichi Watanabe, Ibaraki (JP)

(73) Assignee: NITTO DENKO CORPORATION, Ibaraki-shi (JP)

( * ) Notice: Subject to any disclaimer, the term of this patent is extended or adjusted under 35 U.S.C. 154(b) by 0 days.

(21) Appl. No.: 14/766,167

(22) PCT Filed: Jan. 24, 2014

(86) PCT No.: PCT/JP2014/051510
§ 371 (c)(1),
(2) Date: Aug. 6, 2015

(87) PCT Pub. No.: WO2014/125903
PCT Pub. Date: Aug. 21, 2014

(65) Prior Publication Data
US 2016/0005893 A1 Jan. 7, 2016

(30) Foreign Application Priority Data
Feb. 15, 2013 (JP) ................ 2013-028101

(51) Int. Cl.
*H01L 31/00* (2006.01)
*H01L 31/0392* (2006.01)
*C23C 14/06* (2006.01)
*H01L 31/0749* (2012.01)

(52) U.S. Cl.
CPC ......... *H01L 31/03923* (2013.01); *C23C 14/06* (2013.01); *H01L 31/0749* (2013.01); *Y02E 10/541* (2013.01)

(58) Field of Classification Search
USPC .................................... 136/243–293
See application file for complete search history.

(56) References Cited

U.S. PATENT DOCUMENTS

| 2002/0043278 A1 | 4/2002 | Hashimoto et al. |
| 2013/0152999 A1 | 6/2013 | Lincot et al. |
| 2014/0246087 A1 | 9/2014 | Hiraga et al. |

FOREIGN PATENT DOCUMENTS

| CN | 102437237 A | 5/2012 |
| JP | 2002-124688 A | 4/2002 |

(Continued)

OTHER PUBLICATIONS

Naghavi et al., "Buffer layers and transparent conducting oxides for chalcopyrite Cu(In,Ga)(S,Se)2 based thin film photovoltaics:present status and current developments", Prog. Photovolt: Res. Appl., 2010, 18, pp. 411-433.*

(Continued)

*Primary Examiner* — Thanh-Truc Trinh
(74) *Attorney, Agent, or Firm* — Westerman, Hattori, Daniels & Adrian, LLP

(57) ABSTRACT

A CIGS type compound solar cell excellent in both productivity and conversion efficiency is provided. The CIGS type solar cell includes a CIGS light absorbing layer, a buffer layer and a transparent electrode layer provided in this order on a substrate. The buffer layer is made of a mixed crystal compound containing ZnO, MgO and ZnS being present at specific ranges respectively.

1 Claim, 1 Drawing Sheet

(56) References Cited

FOREIGN PATENT DOCUMENTS

| JP | 2002-343987 A | 11/2002 |
| JP | 2012-19155 A | 1/2012 |
| WO | 2011/151338 A2 | 12/2011 |
| WO | 2013/073149 A1 | 5/2013 |

OTHER PUBLICATIONS

Torndahl et al., "Growth and characterization of ZnO-based buffer layers for CIGS solar cells", SPIE 2010, pp. 1-8.*

Notification of Transmittal of the International Preliminary Report on Patentability (Form PCT/IB/338) of International Application No. PCT/JP2014/051510 mailed Aug. 27, 2015 with Forms PCT/IB/237 and PCT/IB/373. (5 pages).

International Search Report dated Mar. 4, 2014, issued in counterpart International Application No. PCT/JP2014/051510 (2 pages).

Hariskos et al., "The Zn(S, O, Oh)/ZnMgO Buffer in Thin-Film Cu(In, Ga) (Se, S)2-Based Solar Cells Part II: Magnetron Sputtering of the ZnMgO Buffer Layer for In-Line Co-Evaporated Cu(In, Ga) Se2 Solar Cells", Progress in Photovoltaics: Research and Applications, Apr. 28, 2009, pp. 479-488, vol. 17, cited in the ISR.

Office Action and Search Report dated Mar. 23, 2016, issued in counterpart Chinese Patent Application No. 201480008166.6, with English translation. (15 pages).

* cited by examiner

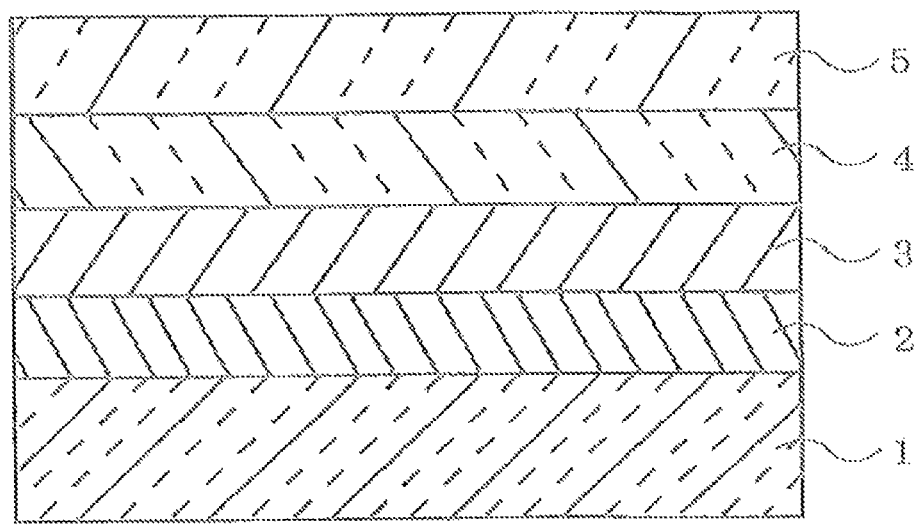

CIGS TYPE COMPOUND SOLAR CELL

TECHNICAL FIELD

The present invention relates to a CIGS type compound solar cell.

BACKGROUND ART

Compound solar cells including a light absorbing layer made of a Group I-III-VI compound semiconductor such as a $CuInSe_2$ (CIS) compound semiconductor containing Group Ib, IIIb and VIb elements or a $Cu(In,Ga)Se_2$ (CIGS) compound semiconductor prepared in the form of solid solution by incorporating Ga into $CuInSe_2$ are known to be advantageous in that they can be produced in the form of a thin film as having a higher light conversion efficiency ("light conversion efficiency" will hereinafter be referred to simply as "conversion efficiency"), and are less liable to suffer from reduction in conversion efficiency due to light irradiation or the like.

A buffer layer of such a CIGS type solar cell including the light absorbing layer made of the CIS or CIGS (hereinafter referred to collectively as "CIGS type") compound semiconductor is generally formed by chemically depositing CdS, Zn(O,S) and the like (see, for example, PTL1). Where the formation of the buffer layer is achieved by the chemical deposition method, the solar cell is produced by forming the CIGS type compound semiconductor layer in a vacuum by a vapor deposition method or a selenization method, once taking out the resulting product to an atmospheric environment to form the buffer layer, and forming a transparent electrode layer again in a vacuum. Problematically, this reduces the productivity.

To cope with this, it is proposed to form the buffer layer by a sequential sputtering method in a vacuum without the need for taking out the product to the atmospheric environment (see, for example, PTL2).

RELATED ART DOCUMENTS

Patent Literature

PTL1: JP-A-2002-343987
PTL2: JP-A-2002-124688

SUMMARY

Where the formation of the buffer layer is achieved in a vacuum by the sequential method with the use of a sputtering apparatus as proposed in PTL2, the productivity is improved, but the conversion efficiency is not significantly improved. Therefore, it is strongly desirable to provide a further higher conversion efficiency while improving the productivity.

In view of the foregoing, it is an object of the present invention to provide a CIGS type compound solar cell which can be produced by forming a buffer layer in a vacuum but not in the atmospheric environment, and yet has a higher conversion efficiency.

According to the present invention to achieve the object described above, there is provided a CIGS type compound solar cell which includes a substrate, and a light absorbing layer, a buffer layer and a transparent electrode layer provided in this order over the substrate, the light absorbing layer comprising at least a Group I-III-VI compound semiconductor, the buffer layer comprising a mixed crystal compound containing ZnO, MgO and ZnS being present at specific ranges respectively.

The inventors of the present invention conducted studies to increase the productivity by performing the buffer layer forming step in a vacuum but not in the atmospheric environment and to provide a higher conversion efficiency. As a result, the inventors found that, where the buffer layer is formed by means of a sputtering apparatus, selenium (Se) is removed from a surface of the CIGS type compound semiconductor layer by plasmas released from the sputtering apparatus to cause defects in the CIGS type compound semiconductor layer. The inventors considered that a CIGS type solar cell excellent in both productivity and conversion efficiency can be produced by repairing the defects during the formation of the buffer layer, and further conducted studies. As a result, the inventors found that, where a specific mixed crystal compound containing ZnS is used as a material for the buffer layer, S is slightly liberated from ZnS of the buffer layer by the plasmas released from the sputtering apparatus during the formation of the buffer layer, whereby Se holes occurring in the surface of the CIGS type compound semiconductor layer are filled with the liberated S to repair the defects. Thus, the inventors attained the present invention.

The inventive CIGS type compound solar cell includes a light absorbing layer of a Group I-III-VI compound semiconductor having a chalcopyrite structure, and a buffer layer of a mixed crystal compound containing ZnO, MgO and ZnS being present at specific ranges respectively. Therefore, even if the light absorbing layer is damaged by plasmas released from the sputtering apparatus to cause defects in a surface of the light absorbing layer (i.e., Se is removed from the surface of the light absorbing layer) when the buffer layer is formed by means of a highly productive sputtering apparatus, Se holes occurring in the surface of the light absorbing layer are filled with S liberated from ZnS of the buffer layer to repair the defects. That is, where the specific mixed crystal compound containing ZnS is used as the material for the buffer layer, it is possible to impart the CIGS type compound solar cell with a higher conversion efficiency, while increasing the productivity of the CIGS type compound solar cell.

BRIEF DESCRIPTION OF DRAWINGS

FIG. 1 is a sectional view of a CIGS solar cell according to an embodiment of the present invention.

DESCRIPTION OF EMBODIMENTS

Next, an embodiment of the present invention will be described.

FIG. 1 is a sectional view of a CIGS solar cell according to an embodiment of the present invention. The CIGS solar cell includes a substrate 1, a rear electrode layer 2, a CIGS light absorbing layer (Group I-III-VI compound semiconductor) 3, a buffer layer 4 and a transparent electrode layer 5 provided in this order, and the buffer layer 4 is made of a mixed crystal compound containing ZnO, MgO and ZnS.

The CIGS solar cell will hereinafter be described in detail. In FIG. 1, the CIGS solar cell is schematically illustrated as having a thickness, a size and an appearance different from actual ones thereof.

A glass substrate, a metal substrate, a resin substrate or the like is used as the substrate 1. Examples of the glass substrate include a lower alkali glass substrate containing an alkali metal element in a very small amount (higher-strain-point glass substrate), an alkali-free glass substrate containing no alkali metal element, and a blue sheet glass substrate. Where the lower alkali glass substrate, the alkali-free glass substrate, a metal substrate or a resin substrate is used, it is desirable to add a very small amount of Na to the substrate during or after the formation of the CIGS light absorbing layer 3.

The substrate 1 is preferably elongated and flexible. In this case, the CIGS solar cell can be produced by a roll-to-roll method or a stepping roll method. The term "elongated" herein means that the length is not less than ten times the width, preferably not less than 30 times the width. The substrate 1 preferably has a thickness of 5 to 200 µm, more preferably 10 to 100 µm. If the thickness is excessively great, the CIGS solar cell is liable to lose its flexibility. Therefore, when the CIGS solar cell is bent, a greater stress is liable to be applied to the CIGS solar cell, thereby damaging the layered structure including the CIGS light absorbing layer 3 and the like. If the thickness is excessively small, on the other hand, the substrate 1 is liable to be buckled in the production of the CIGS solar cell, thereby increasing the product defective percentage.

The rear electrode layer 2 provided over the substrate 1 has a single layer structure or a multi-layer structure formed from molybdenum (Mo), tungsten (W), chromium (Cr) and/or titanium (Ti) by a sputtering method, an evaporation method, an inkjet method or the like. The rear electrode layer 2 preferably has a thickness (a total thickness of the plural layers of the multi-layer structure) of 10 to 1000 µm. Where the substrate 1 doubles as the rear electrode layer 2 (the substrate 1 is electrically conductive), however, there is no need to provide the rear electrode layer 2. If an impurity is thermally diffused from the substrate 1, the impurity adversely influences the performance of the CIGS solar cell. In order to prevent the thermal diffusion, a barrier layer (not shown) may be provided over the substrate 1 or on the rear electrode layer 2. The barrier layer may be formed from Cr, for example, by a sputtering method, an evaporation method, a CVD method, a sol-gel method, a liquid phase deposition method or the like.

The CIGS light absorbing layer (Group I-III-VI compound semiconductor) 3 provided over the rear electrode layer 2 is made of a compound semiconductor containing four elements including copper (Cu), indium (In), gallium (Ga) and selenium (Se). The CIGS light absorbing layer 3 preferably has a thickness of 1.0 to 3.0 µm, more preferably 1.5 to 2.5 µm. If the thickness is excessively small, the light absorbing layer is liable to have a smaller light absorption amount, thereby deteriorating the performance of the solar cell. If the thickness is excessively great, on the other hand, the time required for the formation of the CIGS light absorbing layer 3 is liable to be increased, thereby reducing the productivity. The CIGS light absorbing layer 3 may be formed by a vacuum evaporation method, a selenization/sulfidation method, a sputtering method or the like.

The Cu—In—Ga composition ratio of the CIGS light absorbing layer 3 preferably satisfies an expression of 0.7<Cu/(Ga+In)<0.95 (molar ratio). If the expression is satisfied, $Cu_{(2-x)}Se$ is prevented from being excessively incorporated into the CIGS light absorbing layer 3. In addition, the CIGS light absorbing layer 3 is slightly Cu-deficient as a whole. The ratio of Ga and In, which are the same group elements, is preferably in a range of 0.10<Ga/(Ga+In)<0.40 (molar ratio).

The buffer layer 4 provided over the CIGS light absorbing layer 3 is made of a mixed crystal compound containing ZnO, MgO and ZnS being present at specific ranges respectively. This is a major feature of the embodiment. Even if the CIGS light absorbing layer 3 is damaged by higher-rate sputtering for the formation of the buffer layer 4, the damage can be repaired during the formation of the buffer layer 4 because the mixed crystal compound contains ZnS. Thus, a higher conversion efficiency can be provided. Particularly, where power to be applied to a sputter cathode is increased for improvement of the film forming rate of the buffer layer 4, significant defects are liable to occur in the CIGS light absorbing layer 3. However, the defects can be repaired, so that the higher conversion efficiency can be provided. That is, even if the CIGS light absorbing layer 3 is damaged by plasmas released from a sputtering apparatus during the formation of the buffer layer 4 to result in removal of Se from the surface of the CIGS light absorbing layer 3 (to cause defects in the surface of the CIGS light absorbing layer 3), Se holes occurring in the surface of the CIGS light absorbing layer 3 are filled with S slightly liberated from ZnS contained in the mixed crystal compound of the buffer layer 4 by the same plasmas (which damage the CIGS light absorbing layer 3). Thus, the defects of the CIGS light absorbing layer 3 are repaired. Therefore, the CIGS solar cell can be produced at lower costs with a higher productivity as having its intrinsic higher conversion efficiency.

The mixed crystal compound of the buffer layer 4 preferably has a ZnS content of 0.5 to 5.0 mol %. If the ZnS content of the mixed crystal compound is excessively low, it will be impossible to provide an intended effect. If the buffer layer 4 is formed from a mixed crystal compound having an excessively great ZnS content at a higher film formation rate by means of the sputtering apparatus, a greater amount of S is liable to be liberated from ZnS due to a greater amount of plasmas released from the sputtering apparatus. Therefore, the buffer layer 4 is liable to become amorphous, making it impossible to extract electric current.

The mixed crystal compound of the buffer layer 4 has a molar ratio (MgO+ZnS)/(ZnO+MgO+ZnS) of 0.08 to 0.4 for adjustment of a conduction band with respect to the CIGS light absorbing layer 3. If the molar ratio (MgO+ZnS)/(ZnO+MgO+ZnS) is excessively low, the buffer layer 4 is liable to have a negative conduction band offset with respect to the CIGS light absorbing layer 3. This may result in a greater current loss in an interface between the CIGS light absorbing layer 3 and the buffer layer 4 (i.e., recombination between holes and electrons injected from the transparent electrode layer 5 is more liable to occur to increase a leak current, thereby reducing an open circuit voltage). If the molar ratio is excessively high, on the other hand, the buffer layer 4 is liable to have a higher potential barrier. This prevents migration of electrons generated in the CIGS light absorbing layer 3, making it impossible to sufficiently extract electric current.

The buffer layer 4 may have a single layer structure or a multi-layer structure. The buffer layer 4 having the multi-layer structure has a more excellent pn junction with respect to the CIGS light absorbing layer 3. Where the buffer layer 4 has the multi-layer structure, at least a layer in contact with the CIGS light absorbing layer 3 may be made of the mixed crystal compound containing ZnO, MgO and ZnS. Besides ZnO, MgO and ZnS, exemplary materials for the buffer layer 4 include CdS, ZnMgO, ZnCaO, ZnMgCaO, ZnMgSrO, ZnSrO, $Zn(OH)_2$, $In_2O_3$ and $In_2S_3$, and mixed crystal compounds of any of these compounds such as Zn(O,S,OH) and Zn(O,S). The ZnO-, MgO- and ZnS-containing mixed crystal compound may contain only ZnO, MgO and ZnS, or may additionally contain another component. Examples of another component include those described as the materials for the buffer layer 4. The buffer layer 4 preferably has a thickness of 50 to 200 nm.

After the formation of the CIGS light absorbing layer 3, the buffer layer 4 is formed with the use of a magnetron sputtering apparatus which is a general-purpose sputtering apparatus. Alternatively, a facing-target sputtering apparatus may be used. The facing-target sputtering method differs from the common magnetron sputtering method in that the sputtering is performed with two different cathode targets disposed in opposed relation and with a magnetic field applied perpendicularly from one of the targets to a surface of the other target. In the facing-target sputtering method, the substrate 1 is placed perpendicularly to side surfaces of the targets.

Whether or not the buffer layer 4 thus formed is made of the ZnO-, MgO- and ZnS-containing mixed crystal compound can be checked by crystalline structure analysis by means of an X-ray diffraction (XRD) method. The ZnO—MgO—ZnS composition of the mixed crystal compound can be determined, for example, by X-ray photoelectron spectroscopy.

The transparent electrode layer 5 provided over the buffer layer 4 is preferably made of a material having a higher light transmittance. The transparent electrode layer 5 may be made of ITO, IZO, aluminum zinc oxide (AlZnO) or the like. The transparent electrode layer 5 preferably has a thickness of 50 to 300 nm. The transparent electrode layer 5 preferably has a light transmittance of higher than 80%. The transparent electrode layer 5 may be formed, for example, by a sputtering method, an evaporation method, an organometal vapor-phase epitaxial method (MOCVD method) or the like.

With this arrangement, the CIGS light absorbing layer 3 and the buffer layer 4 can be sequentially formed with the use of the sputtering apparatus in a production process sequence. Therefore, the CIGS solar cell can be produced with a higher productivity without the need for once taking out the resulting substrate to the atmospheric environment after the formation of the CIGS light absorbing layer 3. Even if defects (Se holes) occur in the surface of the CIGS light absorbing layer 3 due to the plasmas released from the sputtering apparatus during the formation of the buffer layer 4, the defects (Se holes) are filled with S liberated from ZnS contained in the buffer layer 4 by the same plasmas. Therefore, the intrinsic higher conversion efficiency of the CIGS light absorbing layer 3 is not impaired even if the buffer layer 4 is formed at a higher rate by the sputtering method. Therefore, the CIGS light absorbing layer 3 may be formed as having a smaller thickness, so that the entire CIGS solar cell can be produced in a thin film form. The CIGS solar cell having the thin film form is capable of transmitting light of non-usable wavelengths at a higher possibility. Therefore, the solar cell has a wider range of use applications and usable areas.

EXAMPLES

Next, inventive examples will be described in conjunction with comparative examples. However, it should be understood that the present invention be not limited to the following examples.

Example 1

Formation of Rear Electrode Layer

Over a degreased surface of a soda-lime glass substrate (having a thickness of 0.55 mm and a size of 20 mm), a rear electrode layer of Mo having a thickness of 0.8 μm was formed at a sputtering rate of 60 nm/min at a sputtering pressure of 1 Pa in an argon discharge gas with the use of a direct current (DC) power source by means of a magnetron sputtering apparatus (SH-450 available from Ulvac, Inc.)

(Formation of CIGS Light Absorbing Layer)

Next, a CIGS light absorbing layer was formed over the rear electrode layer formed in the aforementioned manner. That is, Ga, In, Cu and Se evaporation sources were placed in a chamber of the vacuum vapor deposition apparatus, and the substrate was heated to 550° C. at a temperature increasing rate of 550° C./h with the chamber kept at a vacuum degree of $1 \times 10^{-4}$ Pa. At this time, the Ga, In, Cu and Se evaporation sources were heated to 950° C., 780° C., 1100° C. and 140° C., respectively to simultaneously evaporate these elements. Thus, the CIGS light absorbing layer was formed over the rear electrode layer. The CIGS light absorbing layer thus formed had a composition such that Cu/Group III=0.89 and Ga/Group III=0.31 (atomic %), and had a thickness of 2.1 μm.

(Formation of Buffer Layer)

Subsequently, a buffer layer was formed over the CIGS light absorbing layer formed in the aforementioned manner. The formation of the buffer layer was achieved by means of a magnetron sputtering apparatus (SH-450 available from Ulvac, Inc.) At this time, a target having a composition of ZnO:MgO:ZnS=0.9:0.094:0.006 (molar ratio) was used as a sputtering target. The target contained about 3 atomic % of Ca with respect to Mg as determined by a composition analysis. Argon was used as a discharge gas in the sputtering, and the buffer layer was formed as having a thickness of 70 nm at a power density of 1 kW/cm² at a sputtering pressure of 0.3 Pa with the use of a radio frequency (RF) power source by controlling the power and the formation period.

(Formation of Transparent Electrode Layer)

A transparent electrode layer was formed over the buffer layer formed in the aforementioned manner. The formation of the transparent electrode layer was achieved by means of a magnetron sputtering apparatus (SH-450 available from Ulvac, Inc.) An ITO target having a composition including 90 atomic % of $In_2O_3$ and 10 atomic % of $SnO_2$ was used as a sputtering target. A gas mixture containing argon gas and $O_2$ gas (one tenth the argon gas flow rate) was used as a discharge gas for the sputtering. The ITO film (transparent electrode layer) was formed as having a thickness of 200 nm at a sputtering rate of 20 nm/min at a sputtering pressure of 0.3 Pa at a power density of 1.6 W/cm² with the use of a radio frequency (RF) power source. Thus, a CIGS solar cell of Example 1 was produced.

Examples 2 to 15 and Comparative Examples 1 and 2

CIGS solar cells were each produced in substantially the same manner as in Example 1, except that the ZnO—MgO—ZnS composition (molar ratio) of the mixed crystal compound was changed as shown in Table 1 by changing the sputtering targets in the formation of the buffer layer.

For each of the inventive examples and the comparative examples, 10 CIGS solar cells were produced. Then, the conversion efficiencies of the CIGS solar cells were measured in the following manner, and an average conversion efficiency was calculated. The crystal composition of the buffer layer used for each of the inventive examples and the comparative examples was analyzed in the following manner, and an average ZnS percentage (mol %) and an average molar ratio (MgO+ZnS)/(ZnO+MgO+ZnS) were calculated. The results are also shown below in Table 1.

<Measurement of Conversion Efficiency>

The conversion efficiencies of the CIGS solar cells were each measured by applying artificial sunlight (AM1.5) to an area over the front surface of the CIGS solar cell by means of an IV measurement system (YSS-150 available from Yamashita Denso Corporation).

<Analysis of Crystal Composition of Buffer Layer>

The crystal composition ratio of the buffer layer was determined by analyzing the crystalline structure and the elemental composition of the buffer layer by means of an X-ray diffractometer (D8 DISCOVER available from Bruker Corporation) and an X-ray photoelectron spectrometer (QUANTERA available from Ulvac-Phi, Inc.)

TABLE 1

|  | Crystal composition (molar ratio) | | | ZnS percentage | (MgO + ZnS)/ | Conversion |
|---|---|---|---|---|---|---|
|  | ZnO | MgO | ZnS | (mol %) | (ZnO + MgO + ZnS) | efficiency (%) |
| Example 1 | 0.9 | 0.094 | 0.006 | 0.6 | 0.10 | 10.3 |
| Example 2 | 0.9 | 0.09 | 0.01 | 1.0 | 0.10 | 10.5 |
| Example 3 | 0.9 | 0.08 | 0.02 | 2.0 | 0.10 | 10.8 |
| Example 4 | 0.8 | 0.18 | 0.02 | 2.0 | 0.20 | 10.6 |
| Example 5 | 0.65 | 0.33 | 0.02 | 2.0 | 0.35 | 11.0 |
| Example 6 | 0.9 | 0.07 | 0.03 | 3.0 | 0.10 | 11.3 |
| Example 7 | 0.9 | 0.06 | 0.04 | 4.0 | 0.10 | 11.5 |
| Example 8 | 0.9 | 0.05 | 0.05 | 5.0 | 0.10 | 11.2 |
| Example 9 | 0.85 | 0.1 | 0.05 | 5.0 | 0.15 | 11.3 |
| Example 10 | 0.7 | 0.25 | 0.05 | 5.0 | 0.30 | 10.4 |
| Example 11 | 0.93 | 0.05 | 0.02 | 2.0 | 0.07 | 7.4 |
| Example 12 | 0.5 | 0.45 | 0.05 | 5.0 | 0.50 | 7.7 |
| Example 13 | 0.9 | 0.098 | 0.002 | 0.2 | 0.10 | 9.3 |
| Example 14 | 0.8 | 0.13 | 0.07 | 7.0 | 0.20 | 9.1 |
| Example 15 | 0.7 | 0.23 | 0.07 | 7.0 | 0.30 | 8.3 |
| Comparative Example 1 | 0.96 | 0.04 | 0 | 0 | 0.04 | 4.5 |
| Comparative Example 2 | 0.9 | 0.10 | 0 | 0 | 0.10 | 5.5 |

Finalized English Translation (Your Ref: 150703; Our Ref: 1373-US)

The results of the aforementioned measurement of the conversion efficiencies indicate that the CIGS solar cells of Examples 1 to 15 each had an excellent conversion efficiency with an average conversion efficiency of 7.4% or higher. Particularly, the CIGS solar cells of Examples 1 to 10, in which the ZnS percentage of the mixed crystal compound for the buffer layer was 0.5 to 5.0 mol % and the molar ratio (MgO+ZnS)/(ZnO+MgO+ZnS) was 0.08 to 0.4, were more excellent in conversion efficiency, i.e. each had a conversion efficiency of 10.3% or higher. On the other hand, the CIGS solar cells of Comparative Examples 1 and 2, in which the buffer layer had substantially the same ZnO and MgO contents as in Examples but contained no ZnS, each had a significantly lower average conversion efficiency. It was also confirmed that CIS solar cells have the same tendency as the CIGS solar cells.

While specific forms of the embodiment of the present invention have been shown in the aforementioned inventive examples, the inventive examples are merely illustrative of the invention but not limitative of the invention. It is contemplated that various modifications apparent to those skilled in the art could be made within the scope of the invention.

The inventive CIGS type compound solar cell is highly productive and highly economical, and has a very high conversion efficiency even if having a smaller thickness. Therefore, the CIGS type compound solar cell can be used in a variety of application fields.

REFERENCE SIGNS LIST

1 SUBSTRATE
2 REAR ELECTRODE LAYER
3 CIGS LIGHT ABSORBING LAYER
4 BUFFER LAYER
5 TRANSPARENT ELECTRODE LAYER

The invention claimed is:
1. A CIGS type compound solar cell, comprising:
a substrate, and
a light absorbing layer, a buffer layer and a transparent electrode layer provided in this order over the substrate,
wherein the light absorbing layer comprises at least a Group I-III-VI compound semiconductor,
wherein the buffer layer comprises a mixed crystal compound comprising ZnO, MgO and ZnS,
wherein a ZnS content of the buffer layer is 0.5 to 5.0 mol %, and
wherein a molar ratio (MgO+ZnS)/(ZnO+MgO+ZnS) of the buffer layer is 0.08 to 0.4.

* * * * *